United States Patent [19]
Rotem et al.

[11] Patent Number: 5,465,216
[45] Date of Patent: Nov. 7, 1995

[54] AUTOMATIC DESIGN VERIFICATION

[75] Inventors: Shai Rotem, Hofit; Ze'ev Shtadler, Haifa, both of Israel

[73] Assignee: Intel Corporation, Santa Clara, Calif.

[21] Appl. No.: 71,244

[22] Filed: Jun. 2, 1993

[51] Int. Cl.[6] .................................................. G06F 17/50
[52] U.S. Cl. ........................................ 364/488; 364/578
[58] Field of Search .................................. 364/488, 489, 364/490, 491, 578

[56] References Cited

U.S. PATENT DOCUMENTS

| | | | |
|---|---|---|---|
| 4,922,432 | 5/1990 | Kobayashi et al. | 364/490 |
| 5,146,583 | 9/1992 | Matsunaka et al. | 364/489 |
| 5,163,016 | 11/1992 | Har' El et al. | 364/578 |
| 5,247,468 | 9/1993 | Henrichs et al. | 364/578 |
| 5,278,769 | 1/1994 | Bair et al. | 364/490 |
| 5,282,146 | 1/1994 | Aihara et al. | 364/489 |
| 5,359,537 | 10/1994 | Saucier et al. | 364/489 |

OTHER PUBLICATIONS

E. M. Clarke, J. R. Burch, O. Grumberg, D. E. Long and K. L. McMillan; *Automatic verification of sequential circuit designs*; pp. 105–120 of notes from conference entitled; Mechanized Reasoning and Hardware Design, Published by Prentice Hall, Hemel Hempstead, UK 1992.

E. M. Clarke, D. E. Long and K. L. McMillan; *Compositional Model Checking*; pp. 353–362 of notes from conference entitled: Proceedings. Fourth Annual Symposium on Logic in Computer Science, Published by IEEE Comput. Soc. Press, Washington, DC 1989.

Z. Har'El and R. P. Kurshan; *Software For Analysis of Coordination*; pp. 382–385 of notes from conference entitled: Proceedings of International Conference on Systems, Science and Engineering, Published by Int. Acad. Publishers, Beijing, China 1988.

J. R. Burch, E. M. Clarke, and K. L. McMillan; *Symbolic Model Checking: $10^{20}$ States and Beyond*; pp. 142–170 of Journal: vol. 98, Information and Computation, No. 2, Published by Academic Press, USA 1992.

P. J. Brumfitt; *MetaMorph–a formal methods toolkit with application to the design of digital hardware*; pp. 437–473 of Journal: vol. 2, Journal of Functional Programming, pt. 4, Published by Cambridge Univ. Press, UK Oct. 1992.

Bill Brykczynski, David A. Wheeler; *An Annotated Bibliography on Software Inspections*; pp. 81–88 of vol. 18, SIGSOFT–Software Engineering Notes, No. 1, Published by ACM SIGSOFT, USA Jan. 1993.

E. M. Clarke, D. E. Long and K. L. McMillan; *A Language for Compositional Specification and Verification of Finite State Hardware Controllers*; pp. 281–295 of Journal: Computer Hardware Description Languages and their Applications, Published by Elsevier Science Publishers V. V. (North–Holland) 1990.

(List continued on next page.)

*Primary Examiner*—Vincent N. Trans
*Attorney, Agent, or Firm*—Blakely, Sokoloff, Taylor & Zafman

[57] ABSTRACT

Methods and apparatus for formal verification. In one embodiment, values within a full model for formal verification are parameterized so that the parameters may be defined in order to perform verification on a reduced model. The number of states may then be reduced to allow formal verification on portions of a logic model of complex circuits such as microprocessors using present formal verification techniques. Preprocessor directives are used for multiple and conditional hardware description language generation for representation of a logic model of an integrated circuit, such as a microprocessor. Signals may also be freed from their associated circuitry, and placed into a non-deterministic state. Signals may also be set to a deterministic, designer-specified value. Associated circuitry may then be removed from the logic model for verification of a reduced model. Circuitry specified as "blocks" may also be entirely removed from the model, and all associated circuitry used as inputs to the removed blocks and associated signals may also be removed. Any of these are performed using pre-processor directives. A reduced logic model of a full logic model may then be generated which is used for formal verification.

20 Claims, 6 Drawing Sheets

OTHER PUBLICATIONS

R. P. Kurshan, *Member, IEEE*; and K. L. McMillan; *Analysis of Digital Circuits Through Symbolic Recuction*; pp. 1356–1371 of Journal: vol. 10, IEEE Transactions on Computer–Aided Design of Integrated Circuits and Systems, No. 11, Published in USA Nov. 1991.

Janaki Akella and Kenneth McMillan: *Synthesizing Converters between Finite State Protocols*; pp. 410–413 of notes from conference entitled: International Conference on Computer Design: VLSI in Computers and Processors, Published in USA 1991.

B. Billard; *Improving Verification Tools*; pp. 248–256 of Journal: vol. 12, Journal of Electrical and Electronics Engineering, No. 3, Published in Australia Sep. 1992.

AUTOMATIC DESIGN VERIFICATION

BACKGROUND OF THE INVENTION

1. Field of the Invention

The present invention relates to the design of circuitry. Specifically, the present invention relates to verification of the functionality of the design of logic circuits such as computer systems and integrated circuits.

2. Background Information

One of the problems in modern logic design is the verification that the design actually works in the way it was intended to, according to defined specifications. Various methods include generating software models of the logic circuit design and testing the software model of the design with designer-specified test cases. Because it is not possible to check every possible condition which may be generated in the actual logic design, some of the test cases may not include all of the possible behavior of the logic design, errors may remain because it is not exercised by any of the test cases. Errors in the logic design may remain undetected until the release of a product on the marketplace, when it may cause costly redesigns, and loss of consumer confidence in the product.

An alternative way to check logic design prior to the fabrication of a device is through formal verification. Formal verification is a technique wherein a circuit is modeled as a state transition system, and specifications are provided for components in the system. One way in which specifications may be made is through the use of logic formulas. Each of the components in the logic design is specified, and all possible behaviors of the design may be exercised by a tool which confirms that these specifications are met. Recently, various tools have become available for formal verification such as the Symbolic Model Verification (SMV) software package available from Carnegie-Mellon University, or the COSPAN software package available from Bell Laboratories. These are automatic systems with allow the user to specify the design of the system using software-type commands wherein components in the system are specified by defining input and output signals, and transformation of the signals within each of the components.

Because formal verification exercises all possible behavior of the logic design, and all components in system are defined, this technique has suffered from a deficiency known as "the state explosion problem" due to the very large circuits which are currently being designed. For example, modern microprocessors frequently have more than 3 million transistors. Thus, the number of states which are required to be tested for using formal verification of these circuits are very large indeed and beyond the capabilities of current formal verification techniques.

One way in which such a system may be tested is by reducing the number of states which need to be tested for. One way in which this may be performed is by testing the circuit on a per-property basis. That is, eliminating components (circuitry) and/or signals in a design to reduce the number of states to a number which is able to be performed by current formal verification techniques. A designer could manually eliminate components from a full model and associated circuitry, however, care must be taken that components necessary for testing the desired property are not eliminated. Likewise, the designer may eliminate signals and associated circuitry which are not necessary for testing a desired property. Again, the designer must be careful that associated circuitry which are necessary to test desired properties are not eliminated. Therefore, converting a full model to a reduced model for formal verification poses problems for logic designers.

There is therefore a need to reduce and decompose the model of a circuit down to a size manageable by formal verification tools in a way which maintains that a proof for the properties of a reduced logic model are the same as those for a full logic model from which the reduced model was derived. A need has arisen for tools which assist designers in achieving this goal.

SUMMARY AND OBJECTS OF THE INVENTION

One of the objects of the present invention is to reduce a logic model to enable formal verification of the logic model using present techniques.

Another of the objects of the present invention is to provide a mechanism which allows a designer to reduce a logic model for formal verification without undue effort while preserving signals and components necessary for testing specified properties.

Another of the objects of the present invention is to improve formal verification of complex circuits.

These and other objects of the present invention are provided for by methods and apparatus for formal verification. In one embodiment, values within a full model for formal verification are parameterized so that the parameters may be defined (preferably in a separate file) in order to perform verification on a reduced model. The number of states may then be reduced to allow formal verification on portions of a logic model of complex circuits such as microprocessors using present formal verification techniques. The process may be performed by preprocessing methods and apparatus prior to performing formal verification, such as the SMV (Symbolic Model Verifier) available from Carnegie-Mellon University. In addition, preprocessor directives are used for multiple and conditional HDL (hardware description language) generation for representation of a logic model of logic circuit, such as a microprocessor.

These and other objects of the present invention are provided for by methods and apparatus for formal verification, such as removing circuitry and signals from a logic model, known as "pruning" directives. In one embodiment, signals may be freed from their associated circuitry, and placed into a non-deterministic state. In another embodiment, signals may be set to a deterministic, designer-specified value. In either event, associated circuitry may then be removed from the logic model for verification of a reduced model. In yet another embodiment, circuitry specified as "blocks" may be entirely removed from the model, and all associated circuitry used as inputs to the removed blocks and associated signals may also be removed. Any of these are performed using pre-processor directives. A reduced logic model of a full logic model may then be generated which is used for formal verification using present techniques.

Other objects features and advantages of the present invention will be apparent for dealing the description and figures which follow.

BRIEF DESCRIPTION OF THE DRAWINGS

The present invention is illustrated by example and not limitation in the figures of the accompanying in which like references indicate like elements and in which.

DETAILED DESCRIPTION

A process and apparatus for automatic design verification in a computer system is described for logic designs such as microprocessors and other integrated circuits. In the following description, specific steps, procedures, commands, and other specifics are set forth in order to provide a thorough understanding of the present invention. However, it will be apparent to one skilled in the art that the present invention may be practiced without these specific details. In other instances, well-known systems and methods are shown in diagrammatic, block or flow diagram form in order to not unnecessarily obscure the present invention.

One Embodiment of the Present Invention

Figure 1:
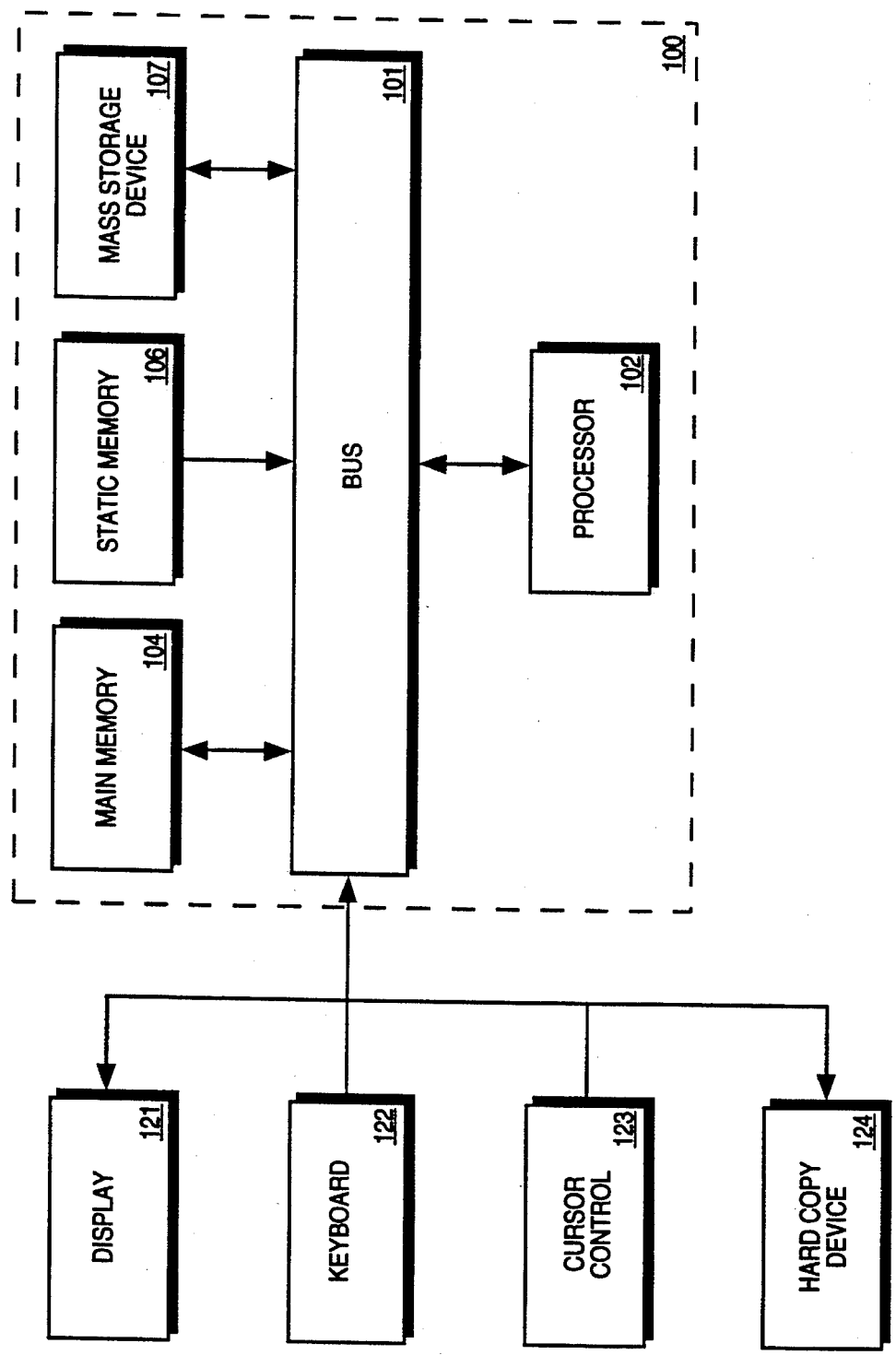
FIG. 1 illustrates a system upon which one embodiment of the present invention may be implemented.

Referring to FIG. 1, a computer system upon which one embodiment of the present invention is implemented is shown as 100. 100 comprises a bus or other communication means 101 for communicating information, and a processing means 102 coupled with bus 101 for processing information. System 100 further comprises a random access memory (RAM) or other dynamic storage device 104 (referred to as main memory), coupled to bus 101 for storing information and instructions to be executed by processor 102. Main memory 104 also may be used for storing temporary variables or other intermediate information during execution of instructions by processor 102. Computer system 100 also comprises a read only memory (ROM) and/or other static storage device 106 coupled to bus 101 for storing static information and instructions for processor 102, and a data storage device 107 such as a magnetic disk or optical disk and its corresponding disk drive. Data storage device 107 is coupled to bus 101 for storing information and instructions. Computer system 100 may further be coupled to a display device 121, such as a cathode ray tube (CRT) or liquid crystal display (LCD) coupled to bus 101 for displaying information to a computer user. An alphanumeric input device 122, including alphanumeric and other keys, may also be coupled to bus 101 for communicating information and command selections to processor 102. An additional user input device may be cursor control device 123, such as a mouse, trackball, stylus, or cursor direction keys, coupled to bus 101 for communicating direction information and command selections to processor 102, and for controlling cursor movement on display 121. Another device which may be coupled to bus 101 is hard copy device 124 which may be used for printing instructions, data, or other information on a medium such as paper, film, or similar types of media.

Note, also, that any or all of the components of system 100 and associated hardware may be used in one embodiment, however, it can be appreciated that any type of configuration of the system may be used for various purposes as the user requires in other embodiments.

In this embodiment, computer system 100 can be an IBM-compatible type personal computer such as those commercially available. Processor 102 can be one of the 80x86 family of microprocessors, such as the Intel 80386 or 80486 manufactured by Intel Corporation of Santa Clara, Calif.

Note that the following discussion of the methods and apparatus of this embodiment discussed herein will refer specifically to a series of routines which are compiled, linked, and then run as object code in computer system 100 during run-time. It can be appreciated by one skilled in the art, however, that the foregoing methods and apparatus may be implemented in special purpose hardware devices, such as discrete logic devices, large scale integrated circuits (LSI's), application-specific integrated circuits (ASIC's), or other specialized hardware. It can be appreciated by one skilled in the art that the description herein has equal application to other apparatus or methods having similar function.

Overview of One Embodiment of Present Invention

Figure 2:
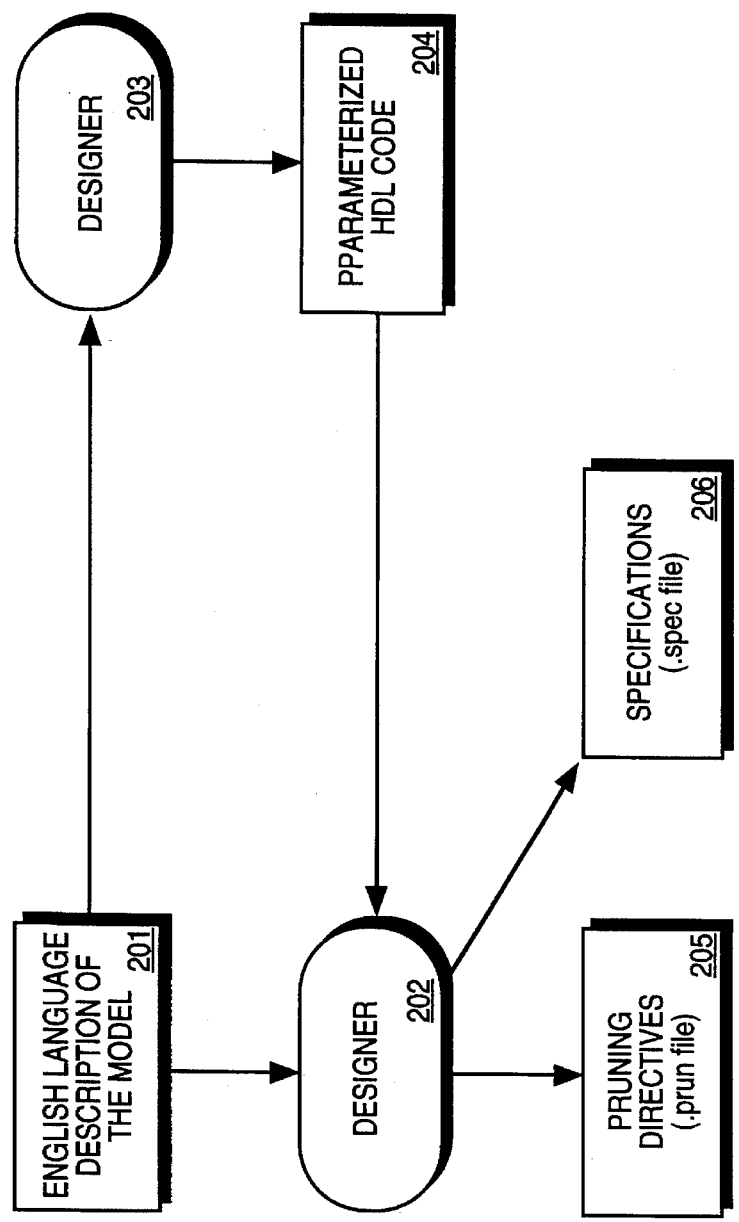
FIG. 2 illustrates a block diagram of a process typically used in logic design, including those files which are created by a logic designer and which are used for formal verification.

FIGS. 2 illustrates the role of logic designers in the design and verification of a logic circuit using the methods and apparatus described in the present application. For example, the designer(s) may have available to them an English language description of the model 201 which defines various components in the system and coupling each of the components of the system via signal paths. Then a designer such as 203 may use this information to create a parameterized hardware description language (HDL) series of statements 204 which is representative of the high level English language description of the model. The HDL code 204 will allow the definition of all the components and signals in the logic design. This hardware description language is similar to that used in current formal verification systems such as the Symbolic Model Verifier (SMV) system available from Carnegie-Mellon University, with some modifications. For example, as will be described below, the HDL code created by designer 203 comprises parameterized descriptions of various components of the system so that reduced sets of non-parameterized HDL specific code may be created which are subsets of the full model. This enables the designer to conveniently vary parameters in the system without manually modifying a full model. In this way, formal verification may be performed on a reduced model without the intensive computation required by verification of the full model, such as a complete microprocessor or other complicated circuit design. At any rate, the parameterized HDL code may be used by another designer such as 202, which may be the same designer 203 illustrated in FIG. 2. This designer will then manually determine which signals and/or blocks may be eliminated or put into a non-deterministic or deterministic states based on the remainder of the model. These "pruning" directives may be then placed into a file 205 to reduce the number of states for verification. Note also that this designer creates a specifications file 206 (having the file extension .SPEC) which is used for confirming the verification of the logic design.

Figure 3:
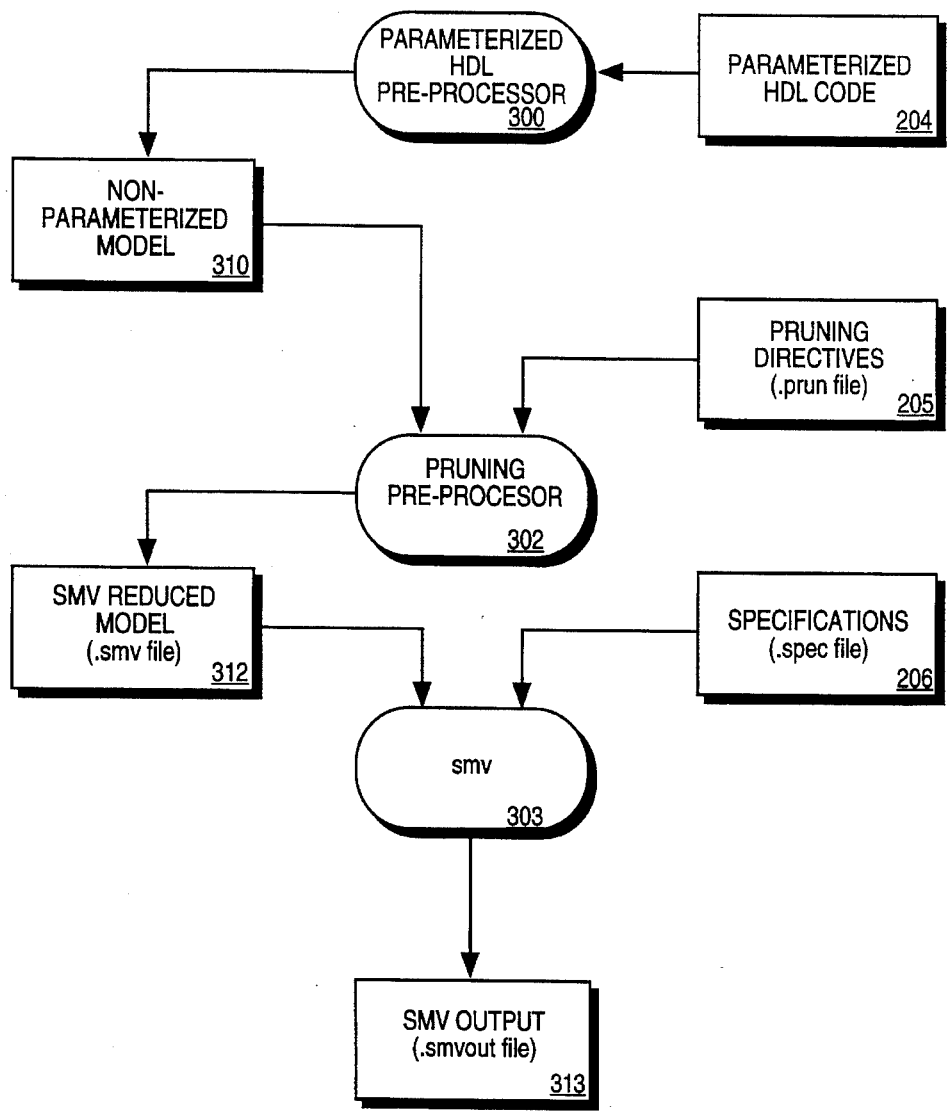
FIG. 3 illustrates a block diagram of the steps used in the process of formal verification, including parameterized models of a logic design, and pruning directives to eliminate the number of states which were present in a logic design.

FIG. 3 illustrates a general flow of the verification of a logic design which is created by various designers such as those discussed with reference to FIG. 2. Each of the intermediate files is illustrated by a rectangular box, and processes are represented by an oval-shape as shown in FIG. 3. As illustrated in FIG. 3, the designer generated parameterized HDL code 204 is input to parameterized HDL preprocessor 300 which converts the parameterized HDL code into non-parameterized model file 310. Then, model 310 is input into a "pruning" preprocessor conversion process 302 which also accepts as inputs the user defined pruning directives file 205 (specified by the file extension .PRUN) for reducing the model to a smaller size for formal verification. As discussed previously and will be discussed in more detail below, these include reducing the models to a manageable representation, such as by eliminating signals or components or setting signals to specific values. This generates a reduced model of the full model. These processes will be discussed in more detail below. At any rate, process 302 converts the non-parameterized model 310 based upon the pruning directives 205 into an SMV model 312 (which has the file extension .SMV). This is used with the specifications file 206 (having the file extension .SPEC) to be input to the verification process SMV 303 for formal verification in this embodiment. As discussed above, the SMV process is the standard SMV package available from Carnegie-Mellon University. Formal verification then takes place as illustrated by process block 303, and the output 313 may have the file extension .SMVOUT. Then, the output file 313 may be converted to various formats by post-processors not shown here.

For the remainder of this application, the improved methods and apparatus take place within the process blocks 300 and 302 illustrated in FIG. 3. These comprise techniques for reducing a full logic model which is represented in a hardware description language which is generated by user, or generated by an intermediate process such as 300 shown in FIG. 3. At any rate, the techniques of the present invention include parameterization of various items such as signal widths, component widths, or other variable information, and the pruning of the model by property, that is, by signal name or component name. In either case, the parameterized hardware description language model of the logic allows the designer to substantially reduce a logic design from a full model so that the formal verification process 303 may be substantially simplified. Parameterization is done is such a manner that verification of the reduced model is done instead of verification of the full model. Thus, the time consuming process of verification of full model is avoided and the state explosion problem can be addressed. The present invention's method and apparatus for removing circuitry, and further for parameterization of the model allow automatic verification of the reduced model which may have equal proof to the verification of the full model without the disadvantages associated with verification of the full model.

For the remainder of this application, the process will be broken into 2 components: preprocessing of a parameterized model 204 performed in process 300; and per-property model reduction (by component and by signal) performed in process 302. Any or all of the techniques described herein may be used in various embodiments of the present invention.

Parameterized Model

One embodiment of the present invention uses a parameterized model 204 for representing the properties which would otherwise be represented with explicit values. In other words, numbers of registers, memory elements, a number of bits, signal lines, data elements, widths of registers, interconnect buses and arithmetic units, for example, may be modeled using parameters. Many values for various components and signals are repeated in a logic design, and this embodiment of present invention take advantage of this fact. Moreover, behavior which is applicable to many signal lines may be applicable to only a few, and the designers may desire to verify given behavior on a subset of a full model. Thus, this embodiment uses a preprocessor shown as block 300 in FIG. 3, which converts parameters specified in an input parameterized HDL to designer-specified values which may be defined in this embodiment in a separate file from the full logic model. These values are known as parameters.

For example, in a prior art method, a user can specify that a particular logic design comprises four (4) registers, wherein each of the registers and signal lines are defined as follows:

REGISTER(output 0, input 0, load0)
REGISTER(output1, input1, load1)
REGISTER(output2, input2, load2)
REGISTER(output3, input2, load3)

Thus, each of the registers is explicitly defined, with each of the inputs and outputs to those specified in the model.

In contrast, the parameterized code representing the same sequence of statements will be generated by a logic designer using the following:

FORCI:=0 UPTO NUMBER_OF_REGISTERS-1 DOC
REGISTER(output%I%, input%I%, load%I%)
ENDC Wherein the parameter NUMBER_OF_REGISTERS is defined separately (preferably in a separate parameter definition file) in the following manner:

NUMBER_OF_REGISTERS=4

All occurrences of NUMBER_OF_REGISTERS is replaced with the static value 4 in the HDL code. In this manner, each of the four statements will be created in the non-parameterized model file 310 by process 300 with the explicit statements for four registers as was shown in the original prior art HDL code above. Note also that the parameterized statements comprise the preprocessor directive "FORC" which instructs the preprocessor 300 to replicate the defined code statement(s) a specified number of times. Note that this statement will also not appear in the final version of the non-parameterized code 310 which is generated by process 300. "FORC DOC" statement directives as shown above function in a similar manner to prior art compilers and the functioning thereof is well-known to those in the compiler arts. The mechanism for enabling the evaluation of these statements will therefore will not be discussed in more detail here, except that the statements are evaluated at pre-verification time in process 300. This embodiment also supports the directives "IFC" and "ELSEC" which allows conditional generation of non-parameterized code by process 300 during pre-processing.

As another example, the width of an inter-connect bus may be modeled. For example, combining two 32-bit buses into a single 64 bit wide bus is normally done in the following manner using typical prior art HDL code:

WIDE_BUS [63:0]:=NARROW_BUS_1 [31:0]& NARROW_BUS_2[31:0]; Thus, the 32 bits of NARROW_BUS_1 are concatenated onto the 32 bits of NARROW_BUS_2 to generate the 64 bit WIDE_BUS. A parameterized model of this description will thus read as follows:

WIDE_BUS [NARROW_BUS_WIDTH*2-1:0]:= NARROW_BUS_1 [NARROW_BUS_WIDTH-1:0] & NARROW_BUS_2 [NARROW_BUS_WIDTH-1:0];

With the parameter NARROW_BUS_WIDTH=32.

The advantage of this technique is that each parameter to vary the model size may be modified in a single place file rather modifying the values in all of the places in the full model. Thus, in the examples given above, the number of registers may be changed by assigning NUMBER_OF_REGISTERS=2 or defining a 2-bit wide bus by modifying the parameter NARROW_BUS_WIDTH=2. Thus, the remaining structure of the model remains unchanged and the designer may modify only limited parameters in the parameter file. This insures that the reduced model is exactly the same as the full model, except for variations to the parameters. Moreover, all the parameters may be placed into a single file (e.g., having the file extension .DEF) and used to define the values of parameters within the model. Different .DEF files may be specified for different portions of the model which are verified. This allows full housekeeping of the full model and the parameterized model, and checking of specific portions of the design.

This embodiment also provides the advantage that separate models need not be kept for the full model and the reduced model, but instead, the preprocessor can modify the parameterized model in defined ways. This has the advantage of automatically insuring correspondence between the full model and the reduced model. In addition, the use of directives within the formal verification process is considered to be an improvement over prior art verification methods.

Figure 4:
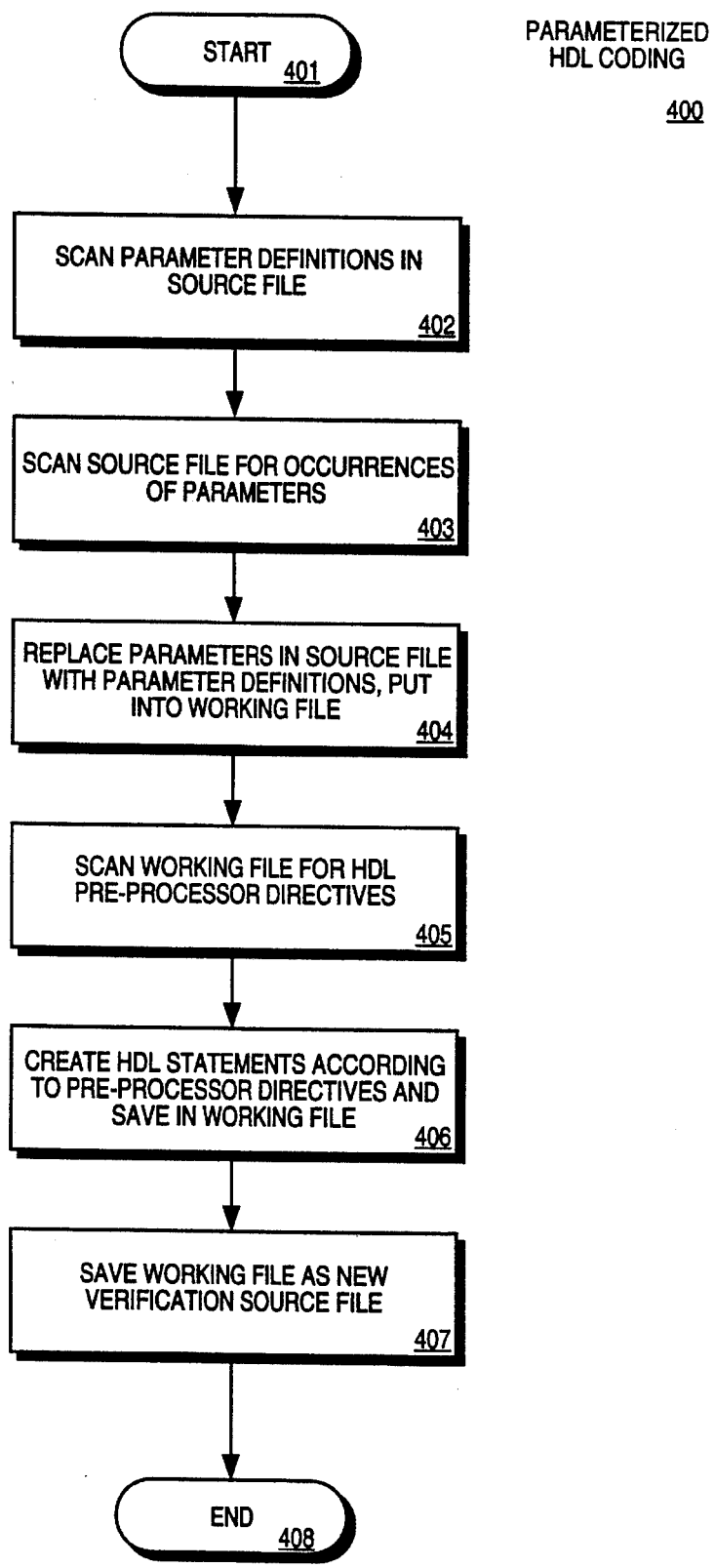
FIG. 4 illustrates a procedure which may be used for parameterized hardware description language (HDL) coding.

The process for interpretation and generation of a reduced model 310 from a parameterized hardware description language coded model 204 is illustrated with reference to FIG. 4.

The process will commence at entry point 401, and the parameter definitions in a parameter source file will be read in as step 402. This may include, but is not limited to, a definitions file (such as that having the file extension .DEF) which may be in a centralized location for defining parameters. Then, the source HDL file may be scanned at step 402 for occurrences of all of the defined parameters. As each parameter is detected, it will be replaced at step 404 with those definitions defined in the .DEF file and place into a temporary storage area such as a working file. Then, at that point, all the parameter definitions have been replaced in the source file, and preprocessor directives may be scanned for. This may be performed as a step such as 405. As each of the preprocessor directives have been detected (such as FORC-DOC or IFC-ELSEC combinations), appropriate non-parameterized HDL statements are created in the working file. Thus, for a FORC-DOC statement, which has a syntax similar to a FOR-DO statement in typical prior art high level programming languages, a number of HDL statements will be repeated for the range which is specified in the FORC-DOC statement. Also, for an IFC-ELSEC combination, depending on the condition detected and using techniques well known to those skilled in prior art compilers, the appropriate HDL statement(s) will be created in the working file. Thus, if the condition tested by the IF statement is present, then the statement under the IFC will be created, otherwise the statement following the ELSEC will be created. These are all done at step 406 shown in process 400. Then, as step 407 the new working file is saved as the new non-parameterized model file (e.g., 310 of FIG. 3), and process 400 terminates at step 408, the process exit point.

Using parameterization, several advantages may be realized over prior art methods of modeling logic. Although the present technique is very powerful and verification for a large parameter may be equally valid for a small parameter, the designer must be careful when choosing parameters to use for reduced model verification, because certain parameter values may or may not hold for the full model. For example, a particular bit width may be assumed for a register wherein the most significant bit in the register represents a sign bit. Special logic may be applied to the sign bit in the logic design. If a parameter is chosen so that the sign bit is eliminated, then verification will not be valid for very small values of the parameter (e.g., 1). Thus, the designer must be careful in choosing specific parameters to be used, however, the advantages of parameterization far exceed any disadvantages posed by these methods.

Per-Property Pruning of the Logic Model

A second technique used in the present invention to address the state explosion problem is use of "pruning" directives to reduce the HDL model. In typical prior art logic models, a property is specified with input/output signals and the generation of the output signals using the input signals. Typically, not all of the inputs and outputs of certain blocks are required for verification of certain properties of a logic design. For example, only specific signal(s) for specific component(s) are desired to be verified. Thus, the designer may specify in a pruning directives file 205 (identified by the file extension .PRUN) illustrated in FIG. 3, that certain signals and components are desired to be removed from the model to be verified. This is also done prior to generation of the resulting SMV model file 312 which is used for verification by SMV process 303. Signals and components may be removed using the following pruning directives:

FREE <signal name>: This directive makes the signal specified by signal name unrestricted (non-deterministic input). The part of the model which generates this signal is removed, and the signal becomes an input to the rest of the model.

SET <signal name>=<value>: This directive makes the signal specified by signal name deterministic (constant) to <value>. The part of the model which generates this signal is removed, and the signal <value> becomes an input to the rest of the model.

BLACKBOX <block_name>: The block specified by block_name is removed from the model, and its outputs become "free" inputs to the rest of the model.

The signal(s) FREE'd, SET or the signals generated by block(s) which are made a BLACKBOX are then used for formal verification of the model. In function, the techniques are similar because circuitry used to generate the signals is eliminated (reducing the number of states to be verified in the reduced model), however, the BLACKBOX function differs and that it actually frees a plurality of signals which are the outputs from the BLACKBOX component(s). Also, the SET directive makes a signal a constant further reducing the number of states in the reduced model. Specific operation of each of the processes for performing model reduction are illustrated with reference to FIGS. 5 and 6.

Figure 5:
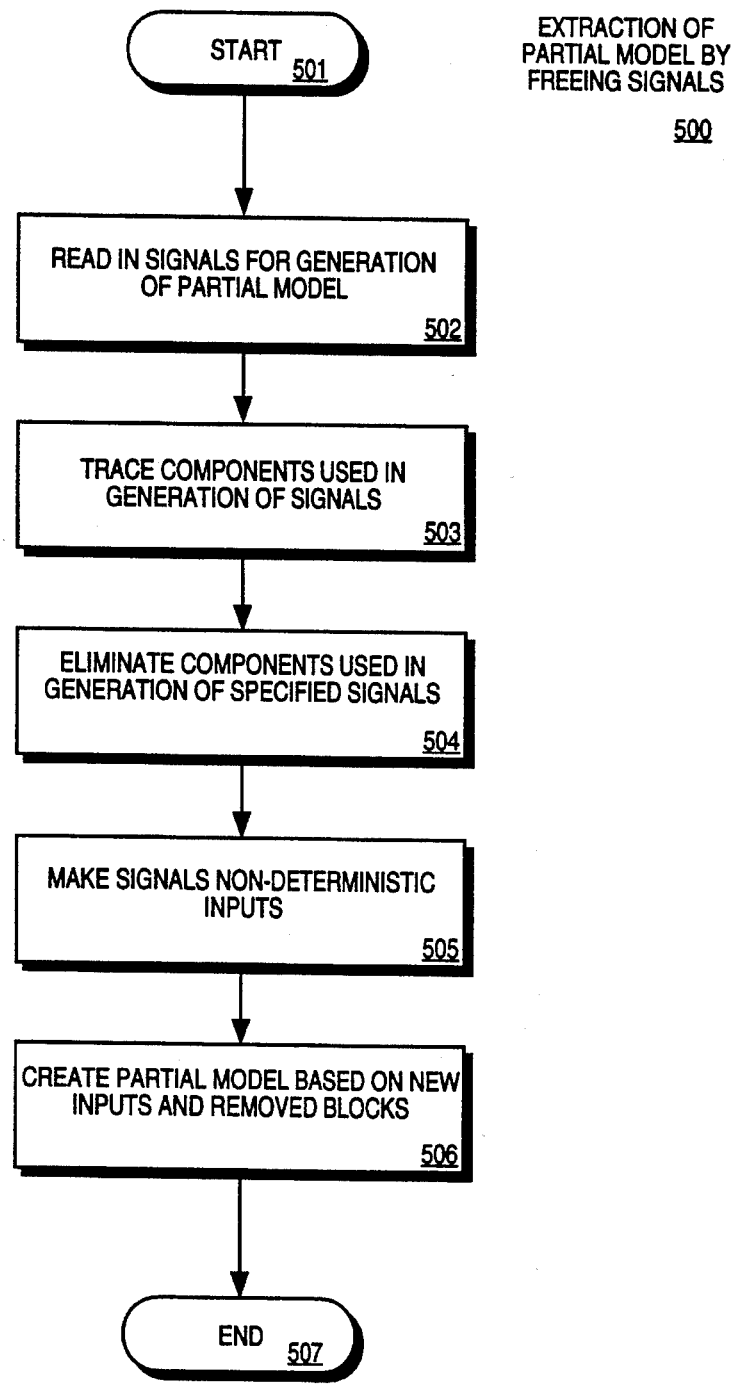
FIG. 5 illustrates the extraction of a partial model from a hardware description language logic model by freeing signals by signal name.

For example, FIG. 5 illustrates a process 500 which is used for extraction of a reduced HDL model by FREE'ing signals. This process would be performed upon the detection of the directive FREE <signal_name>. The process starts at the process entry point 501, and reads in <signal name> from the pruning directives file 205 for the generation of the partial model at step 502. Then, each signal specified can be traced throughout the entire logic model at step 503, and, step 504, those components used in a generation of the specified signal may be eliminated at step 504. It should be noted that only the components that generate these particular signals will be removed, and any components used in a generation of a plurality of signals will not be removed. Then at step 505 using well known SMV statements, the signals identified by <signal_name> are converted to non-deterministic inputs so that various values of the signals may be determined. However, the circuitry used to create the signal is removed from the model so that verification need not take place on those particular aspects of the model. Finally, the partial model based upon the non-deterministic inputs and removed components from the model is created at step 506 and saved as the resulting file (e.g., 312 of FIG. 3) to be input to formal verification process 303 (e.g., the SMV package available from Carnegie-Mellon University). Finally, process 500 of FIG. 5 terminates at step 507, the process exit point.

The SET <signal_name>=<value> directive is evaluated and processed in a similar manner to process 500, however, instead of <signal_name> being placed into a non-deterministic state, it is placed into a deterministic state as specified by <value> at step 505 of FIG. 5. Then, this signal is used as an input to the rest of the model.

Alternatively, specific components for a block may be removed from the model. This is done by issuing the pruning directive BLACKBOX <block_name>. The process for eliminating blocks is similar to that specified for FREE'ing signals illustrated in FIG. 5, however, entire blocks and associated signals are removed from the model.

Figure 6:
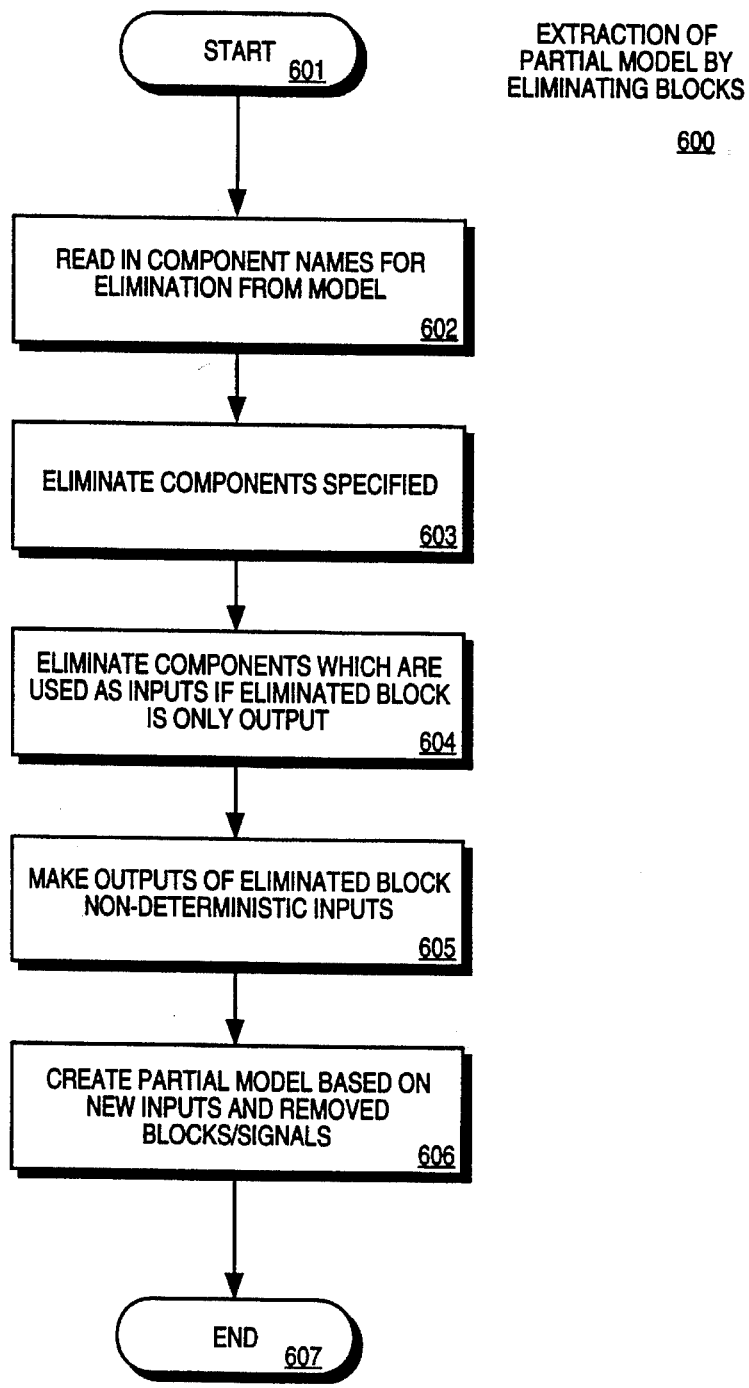
FIGS. 6 illustrates an extraction of a partial model by eliminating components or blocks from within a logic design, as specified in a hardware description language.

The process for removing blocks is discussed with reference to FIG. 6. Process 600 of FIG. 6 commences at the process entry point 601, and component names for elimination from the model are received at step 602. Again, these may be received from a pruning directives file 205 illustrated in FIG. 3, wherein each of the blocks desired to be removed is proceeded by the directive BLACKBOX. Then, at step 603, the components identified by BLACKBOX are eliminated from the defined logic model. At step 604, components which are exclusively used as inputs to the block are eliminated if the block is the only output. Then, the outputs of the eliminated block are assigned to be non-deterministic inputs whose states are to be varied during formal verification at step 605. Finally, a partial model is created with the appropriate code for each of the outputs from the removed block, at step 606, as non-deterministic signals and the process ends at exit point, step 607. Thus, at this point, partial model 312 is created of the parameterized HDL model of the logic which may be input to a formal verification process such as SMV process 303 of FIG. 3.

Thus, by using any of the techniques described above, the state explosion problem is addressed, and advantages are provided over prior art testing of full logic models of design. Again, care must be taken for those signals and blocks which are removed from the model to insure that adequate verification still takes place. However, the advantages realized by this technique provides significant advantages over prior art verification of full logic models.

Thus, using the prior techniques and methods, substantial advantages over prior art methods of verification may be realized. Although specific embodiments of the present invention have been described specifically with reference to FIGS. 1–6, they are to be viewed in illustrative manner rather than in a restrictive sense, and modifications in other departures from the techniques described herein may be performed by one skilled in the prior art without departing from the general spirit and scope of the present invention.

What is claimed is:

1. In a computer system, an automatic method for formal verification of a portion of a logic circuit, comprising the following steps:

a. receiving a parameterized model of said logic circuit from a first file, said parameterized model of said logic circuit including parameterized expressions representing components in said logic circuit, wherein said expressions include parameters which may be defined externally;

b. defining said parameters externally to said parameterized model, said defining including assigning values to certain of said parameters which specify that fewer components are in said parameterized model of said logic circuit than a full model of said logic circuit;

c. for each of said parameterized expressions in said parameterized model, generating component description statements in a hardware description language (HDL) for said components using said externally defined parameters, and storing a reduced model of said logic circuit in a second file for further processing, wherein said reduced model of said logic circuit comprises a subset of said full model of said logic circuit; and d. transmitting said second file to a process for formal verification, said process for formal verification performing formal verification on said reduced model of said logic circuit using said second file.

2. The automatic method of claim 1 wherein said parameterized model of said logic circuit comprises directives for controlling the operation of said parameterization process.

3. The automatic method of claim 2 wherein said directives comprise conditional statements based upon said externally defined parameters.

4. The automatic method of claim 3 wherein said step of generating said component description statements includes generating alternative component description statements based upon said externally defined parameters and conditions detected based upon said conditional statements.

5. The automatic method of claim 2 wherein said directives comprise sequential statements based upon said externally defined parameters.

6. The automatic method of claim 5 wherein said step of generating said component description statements includes generating a plurality of component description statements based upon said externally defined parameters and said sequential statements.

7. In a computer system, an automatic method for formal verification of a portion of a logic circuit, comprising the following steps:

a. receiving a full model of said logic circuit defined in a first file, said full model of said logic circuit including expressions representing components in said logic circuit and input and output signals for each of said components;

b. receiving a list of properties which are not pertinent to the development of a reduced model of said logic circuit for said formal verification of said portion of said logic circuit;

c. eliminating each of said component expressions in said full model which are used in the generation of or as inputs to said properties and storing expressions remaining from said first file after said elimination in a second file, said second file being a reduced model of said logic circuit, wherein said reduced model of said logic circuit comprises a subset of said full model of said logic circuit; and d. transmitting said second file to a process for formal verification, said process for formal verification performing formal verification on said reduced model of said logic circuit using said second file.

8. The automatic method of claim 7 wherein said properties include signal names, and said component expressions which are eliminated include component expressions used only for said generation of or as said inputs to other component expressions which generate said signals.

9. The automatic method of claim 8 wherein said signal names are assigned to constant values.

10. The automatic method of claim 8 wherein signal names are made non-deterministic input values to said reduced model.

11. The automatic method of claim 7 wherein said properties include component names, and said component expressions which are eliminated include component expressions used only as said inputs to expressions having said component names.

12. The automatic method of claim 11 wherein signals which are output from said component names are assigned to constant values.

13. The automatic method of claim 11 wherein signals which are output from said component names are made non-deterministic input values to said reduced model.

14. In a computer system, an automatic method for formal verification of a portion of a logic circuit, comprising the following steps:

a. receiving a parameterized model of said logic circuit from a first file, said parameterized model of said logic circuit including parameterized expressions representing components in said logic circuit, wherein said expressions include parameters which may be defined externally;

b. defining said parameters externally to said parameterized model, said defining including assigning values to certain of said parameters which specify that fewer components are in said parameterized model of said logic circuit than a full model of said logic circuit;

c. for each of said parameterized expressions in said parameterized model, generating component description statements in a hardware description language (HDL) for said components using said externally defined parameters, and storing a reduced model of said logic circuit in a second file for further processing, wherein said reduced model of said logic circuit comprises a subset of said full model of said logic circuit;

d. receiving a list of properties which are not pertinent to the development of said reduced model of said logic circuit for said formal verification of said portion of said logic circuit;

e. eliminating each of said component expressions in said full model which are used in the generation of or as inputs to said properties and storing expressions remaining from said second file after said elimination in a third file, said third file being a reduced model of said logic circuit, wherein said reduced model of said logic circuit comprises a subset of said full model of said logic circuit; and f. transmitting said third file to a process for formal verification, said process for formal verification performing formal verification on said reduced model of said logic circuit using said second file.

15. The automatic method of claim 14 wherein said properties include signal names, and said component expressions which are eliminated include component expressions used only for said generation of or as said inputs to other component expressions which generate said signals.

16. The automatic method of claim 15 wherein said signal names are assigned to constant values.

17. The automatic method of claim 15 wherein signal names are made non-deterministic input values to said reduced model.

18. The automatic method of claim 14 wherein said properties include component names, and said component expressions which are eliminated include component expressions used only as said inputs to expressions having said component names.

19. The automatic method of claim 18 wherein signals which are output from said component names are assigned to constant values.

20. The automatic method of claim 18 wherein signals which are output from said component names are made non-deterministic input values to said reduced model.

* * * * *